United States Patent [19]
Toro

[11] Patent Number: 5,274,911
[45] Date of Patent: Jan. 4, 1994

[54] ELECTRONIC COMPONENTS WITH LEADS PARTLY SOLDER COATED

[75] Inventor: Joseph A. Toro, Ogallala, Nebr.

[73] Assignee: American Shizuki Corporation, Ogallala, Nebr.

[21] Appl. No.: 780,111

[22] Filed: Oct. 21, 1991

[51] Int. Cl.⁵ .............................................. H01R 43/00
[52] U.S. Cl. ............................... 29/827; 29/884; 29/885
[58] Field of Search ............... 29/827, 854, 884, 885, 29/874; 361/405; 228/180.2

[56] References Cited

U.S. PATENT DOCUMENTS

| | | | |
|---|---|---|---|
| 4,045,869 | 9/1977 | Hartmann et al. | 29/884 |
| 4,204,317 | 5/1980 | Winn | 29/885 |
| 4,593,463 | 6/1986 | Kamono et al. | 29/884 |
| 4,633,583 | 1/1987 | Kato | 29/827 |
| 4,722,060 | 1/1988 | Quinn et al. | 228/180.2 |
| 4,809,054 | 2/1989 | Waldner | 29/827 |
| 4,820,658 | 4/1989 | Gilder, Jr. et al. | 29/827 |
| 5,098,863 | 3/1992 | Dolezal et al. | 29/827 |
| 5,176,255 | 1/1993 | Seidler | 29/827 |

FOREIGN PATENT DOCUMENTS 0154247 3/1982 Fed. Rep. of Germany ........ 29/884

OTHER PUBLICATIONS

Conference Proceedings of the 28th Electronic Components Conference Anaheim Calif. USA (Apr. 24-26, 1978) "Bonded Gold Figures As Low Cost Alternative to Patterned Edgeboard Fingers for Gerard PWB Use." Vernon Brown.

*Primary Examiner*—Irene Cuda
*Attorney, Agent, or Firm*—Gregory B. Wood

[57] ABSTRACT

An electrical device includes an electrical component encased in encasement material with leads electrically coupled to the component and extending through the encasement material for attachment to an electrical circuit. The leads include an internal region plated with solder for attachment to the component, an external region plated with solder for electrically coupling the component to a circuit board, and an intermediate region between the internal and external regions which is devoid of solder and which is positioned to be in contact with the encasement material to define an unplated interface between the lead and the encasement material. Leads having a center region devoid of solder plating may be formed by providing a lead frame, with selectively plated and punched regions of the lead frame to form the internal and external lead portions, plating the internal and external lead portions with solder and thereafter punching the center unplatted region to provide a plurality of leads having a center unplatted region. Components are thereafter electrically coupled to the solder plated internal portions of the leads on the lead frame with the leads and attached electrical components encased in an encasement material so that the encasement material is in direct contact with the unplatted center region of the leads.

9 Claims, 2 Drawing Sheets

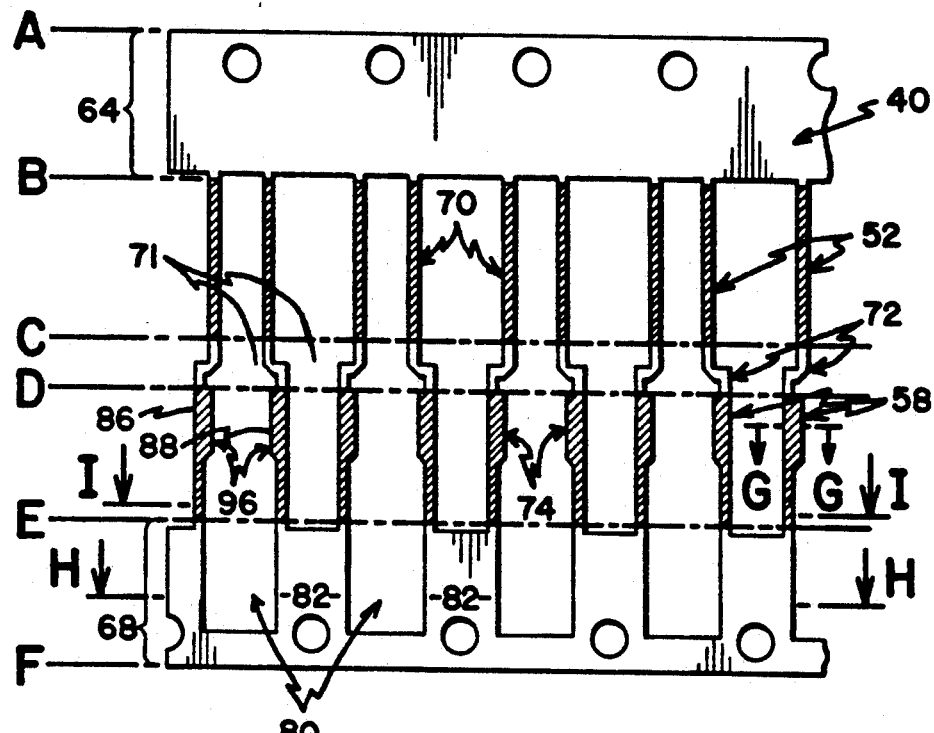
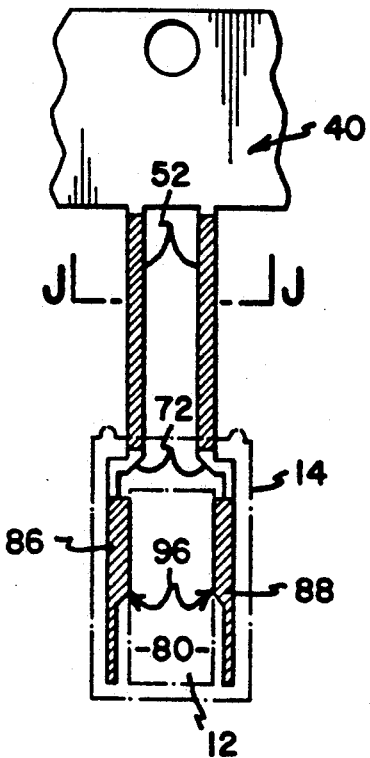
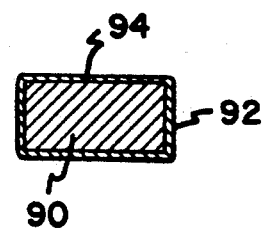
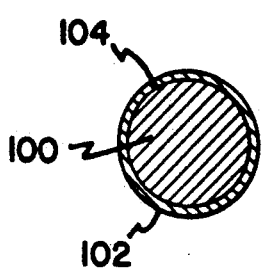

ELECTRONIC COMPONENTS WITH LEADS PARTLY SOLDER COATED

BACKGROUND OF THE INVENTION

The present invention relates to electrical components and methods for making electrical components and in particular to electrical components with leads having selected regions plated with solder and other regions devoid of solder plating. The regions devoid of solder plating contact an encasement material which encases the electrical component so that voids or spaces in the interface between the encasement material and the leads are not formed when the leads are heated during subsequent soldering.

The problem of flux or wash residue contaminants penetrating a case or housing in which an electrical component is encased is well known. Specifically, such wash residues or fluxes penetrate the encasement through small voids in the interface between the leads and the encasement. Such voids or spaces between the leads and the encasement material can be formed during the solder reflow processes such as wave or hand soldering or board washing operations. If not properly removed, flux or washing residues can enter the interior of the electrical device through such interface spaces causing component failure.

For example, in solder ref low processes, amine-activated water soluble fluxes are used followed by reflow soldering and water rinses. This process can cause small openings between the interface between the lead and the encasement material. During the reflow solder process these small openings provide a path to the interior of the electronic component in the encasement material allowing solder residue contamination and ultimate component failure.

While the mechanism that causes the opening of these paths or voids between the leads and the encasement material is not exactly known, one hypothesis is that the path is caused by capillary action during reflow allowing the plating material on the lead to migrate in the direction of the solder wave thereby leaving small openings at the case-to-lead interface. Another hypothesis is that the heat involved in the solder reflow process causes differential expansion of the encasement material-to-lead interface. After the thermal cycle of heating and cooling, small openings may be left at the interface between the lead and the encasement.

Regardless of the cause, any small openings that accumulate residues are detrimental to the normal performance and life of the particular component. It is therefore desired to eliminate openings between the lead-to-encasement interface during the reflow process to thereby minimize the problem of residues being deposited inside the interface between the lead and encasement.

SUMMARY OF THE INVENTION

According to the invention, electrical devices having an electrical component encased in a housing with leads extending through the encasement or housing for external connection to a circuit board include leads which are plated with solder in selected regions and left unplatted in other regions whereby the unplatted regions directly contact the encasement material to provide a void and space free interface between the leads and the encasement material along the region from the interior to the exterior of the encasement. Accordingly, the plated areas of the leads are provided only in regions along the lead which must be tinned for ease of reflow soldering. As such, during reflow soldering the unplatted metallic surface of the leads do not "wet" because of the solder coating and thereby remain adhered to the encasement materials preventing the formation of voids or spaces during the reflow process and eliminating the possibility of flux or wash residue contamination that is the direct cause of the failure of the electrical device.

In accordance with the invention, leads which are round or oval in shape may be selectively plated by dipping first one end and then the other end of the lead in a solder bath leaving a region between the two ends unplatted to enable the direct contact between the lead and the encasement material in the interface region.

In another embodiment, an electrical device may be made by first providing a lead frame, punching out selected regions in the lead frame to define a first unpunched region, a first punched region, a center unpunched region, a second punched region and a second unpunched region. The step of punching is provided to form a plurality of external leads extending between the first unpunched region and the center unpunched region through the first punched region and a plurality of internal leads extending between the center unpunched region and the second unpunched region through the second punched region. The resultant punched lead frame is then masked leaving only the external leads of the lead frame unmasked. The unmasked external leads are then plated with solder in a conventional manner. Once the external leads have been plated, the lead frame is masked again, this time leaving only the internal leads unmasked. The unmasked internal leads are then likewise plated with solder. Selected parts of the center region between the internal leads and the external leads is then punched so as to define a plurality of leads between the first unpunched region and the second unpunched region. Each lead so formed by the punching steps will have an external plated region, an unplatted center region and an internal plated region.

In order to use the resultant lead frame in the manufacture of electrical devices such as encased capacitors, a selected portion of the lead frame is removed by punching or other suitable method to thereby detach the internal leads from the second unpunched region of the lead frame. An electronic component, such as a capacitor, is then inserted between adjacent pairs of the internal leads with the component being electrically attached to the leads by soldering or other suitable means. The electronic component and the attached internal leads are then encased in an encasement material such as epoxy thereby encasing both the internal plated region of the leads and the electronic component with the encasement material contacting at least a portion of the unplatted center region of the leads. Finally, the individual electronic devices encased in the encasement material are removed from the lead frame by detaching the ends of the external leads from the first unpunched region of the lead frame.

The electronic components encased may include integrated circuits, discreet capacitors, resistors, or inductors or any other electrical component. The leads themselves may be made from copper, copper alloys, phosphor bronze alloys, brass alloys, nickel-silver and other metals or metal alloys. The plating materials may be 60/40 tin-lead, gold, gold alloys, various other tin-lead alloy combinations, silver, platinum, palladium or other plating materials used for component terminations.

BRIEF DESCRIPTION OF THE DRAWINGS

The invention may be understood with reference to the following description taken into conjunction with the accompanying drawings wherein similar characters refer to similar elements throughout and in which:

FIGS. 2A, 2B and 2C illustrate the method of making lead frames and electrical devices incorporating lead frames according to the invention.

FIG. 3 is a cross-sectional view of a portion of a lead through section G—G in FIG. 2B.

FIG. 4 is a cross sectional view of a portion of a round lead section.

DETAILED DESCRIPTION

Figure 1:
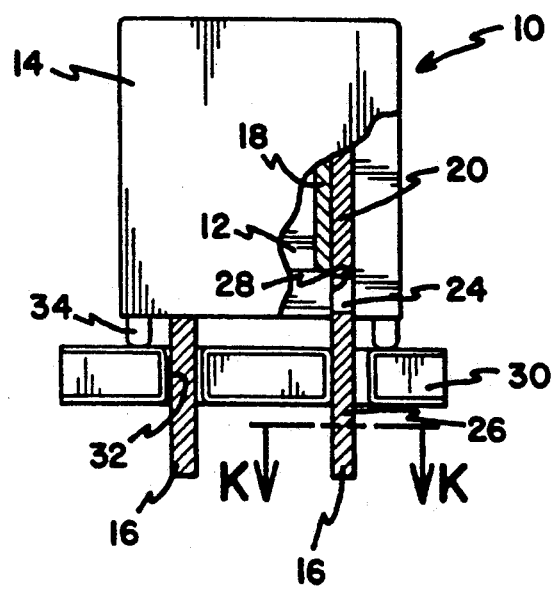
FIG. 1 is a discreet electrical device shown interconnected to a circuit board and having a cutaway portion illustrating the leads and the relationship of the different portions of the leads to both the component and the encasement for the component.

Referring to FIG. 1, an electronic device 10 includes an electronic component 12 which may be a capacitor, resistor, integrated circuit or any other electronic component, positioned inside a housing or encasement of 14. Leads 16 are electrically coupled to the component 12 and extend through the encasement 14 to define a lead-to-component interface 18. In order to permit a solder joint at the lead-to-component interface 18, an internal lead region 20 is plated with solder 22. The internal lead region 20 are then attached to the component 12 by a suitable soldering techniques such as heat reflow or laser reflow.

In accordance with the invention, the leads 16 also include an intermediate or center unplatted region 24 which is between the internal plated lead region 20 and an external solder plated region 26. The unplatted region 24 is accordingly devoid of any solder plating and is positioned along the lead at a location which will directly contact the encasement 14 so that the material from which the encasement is made directly contacts the unplatted region to define a lead-to-encasement interface 28. The external plated region 26 of the lead 16 extends from the encasement 14 to provide a means of electrically attaching at the lead 16 to a suitable circuit board 30 or other external attachment. As illustrated in FIG. 1, the external plated regions 26 extends through the mounting holes 32 in the circuit board 30 and are soldered to the circuit board of 30 in a conventional manner.

In the preferred embodiment, the encasement 14 further includes stand-off nubs 34 to provide a space between the electrical device and the surface of the circuit board 30.

As previously described, leads coupled to an electrical component encased within an encasement material or housing are conventionally plated with solder over their entire surface. In the course of manufacturing or attaching the leads extended through the encasement to a circuit board, the solder plating on the leads in the interface between the lead and the encasement will often flow thereby creating small gaps or voids in the lead-to-case interface. These voids permit the solder flux or other contaminates to pass into the internal region of the electrical device and have been found to be a major cause of failure. In order to eliminate this problem, the present invention provides a region of the lead which is unplatted thereby allowing the surface of the lead itself to come in direct contact with the material from which the encasement 14 is made. Accordingly, a direct seal along the interface between the lead and the encasement is created which will not be effected by soldering.

Figure 2A:
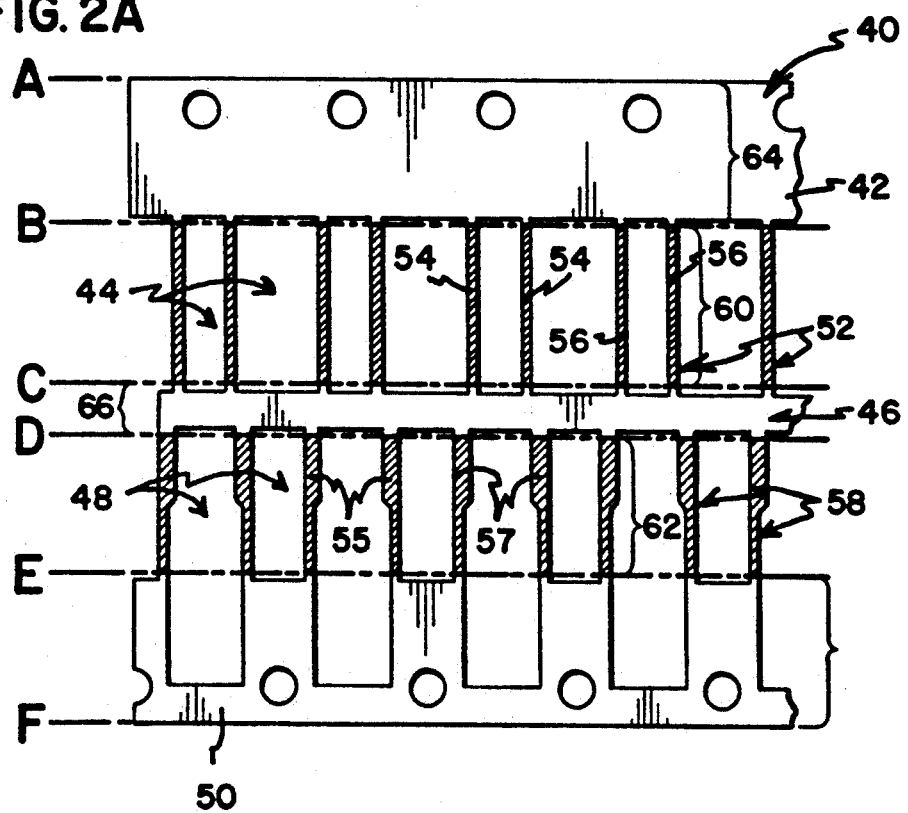

Referring to FIGS. 2A, 2B and 2C, a method for making a lead frame component having a center region devoid of solder is illustrated. Initially, a suitable sheet of copper or other conductive material is die cut or punched to define a lead frame 40 with a first unpunched region 42, a first punched region 44, a center region 46, a second punched region 48 and a second unpunched region 50. The step of punching forms a plurality of strips defining external leads 52 between the first unpunched region 42 with the center region 46. Preferably, the die cutting or punching is such that the external leads 52 are grouped in pairs such as first pair 54 and second pair 56.

Similarly, the step of punching forms a plurality of strips defining internal leads 58 between the center region 46 to the second unpunched region 50. Preferably, the die cutting or punching is such that the internal leads 58 are grouped in pairs such as third pair 55 and fourth pair 57. The first punched region 44 consequently defines a plurality of individual spaces or punched regions between external leads 52 and the second punched region 48 includes a plurality of individual spaces between the internal leads 58. Of course, various configurations for the punched regions can be formed in accordance with the invention. For example, any number of leads can be grouped depending on the needs of the component to which the leads are to be attached. Also, many different punching configurations can be used to facilitate manufacturing of individual components.

Following the initial step of creating the first punched region 44 and the second punched region 48, the lead frame 40 is masked by any suitable technique which may, for example, be conventional photo resist techniques (common in the manufacturing of semiconductors) or any other suitable masking technique whereby the regions designated A-B and C-F (FIG. 2A) of the lead frame 40 are masked leaving exposed only the region B-C. The exposed region B-C is then plated with a solder material by conventional plating techniques to form a thin solder coating over the portions of the external leads which are exposed in the region B-C to thereby define external plated regions 60 of the external leads 52. The external plated region 60 define those portions of the leads extending from the encasement 14 of the electrical device 10 for which will be soldered to the circuit board 30 in the manner illustrated in FIG. 1.

Following plating of the region B-C, the regions A-D and E-F are masked in a like manner thereby leaving exposed the region D-E. The lead frame 40 is once again plated with solder, the result being that only the portions of the internal leads 58 which remain unmasked in the region D-E will be plated with solder, the plated portion of the internal leads 58 defining an internal plated region 62 of the internal leads 58. The result is a lead frame 40 which has a first unplatted region 64 in the region A-B, an external lead plated region 60 in the region B-C, a center unplatted region 66 in the region C-D, an internal lead plated region 62 in the region D-E and a second unplatted region 68 in the region E-F.

Referring to FIG. 2B, the resultant lead frame 40 illustrated in FIG. 2A is again die cut or punched in the center unplatted region 66 to define, a third punched region 71, the punching occurring so that individual external leads 52 are connected to individual internal leads 58 to define a plurality of leads extending, for example, between the first unplatted region 64 and the second unplatted region 68. Each such lead will consequently have an external plated region 70, an unplatted center region 72 and an internal plated region 74. With the third punched region 71 begin such as to form the individual unplatted centered region 72 of each of the leads.

In accordance with the invention, the region A-B of the lead frame 40 and the region E-F of the lead frame can be removed with the individual leads thereafter being appropriately attached to the component and encased in the encasement as illustrated in FIG. 1. However, in a preferred embodiment where the leads are attached to an electronic component such as a capacitor, the lead frame 40 may be die cut along the section H—H in FIG. 2B to provide an opening 80 between adjacent pairs of leads to be attached to a single component with a connecting support 82 remaining between adjacent leads of adjacent unpaired leads.

Referring to FIG. 2C in connection with FIG. 2B, an electronic component 12 may be inserted into the space 80 between, for example, the pair of leads 86 and 88. Electrical contact is advantageously made by providing, during the first step of punching, inwardly directed component contact protrusions 96 which provide a physical contact point between the component 12 and the leads 86 and 88. An initial mechanical connection is made by moving the component forward so it is positioned firmly between lead protrusions 96. The leads 86 and 88 can then be suitably soldered to the component 12 in any of several conventional ways. The result is a lead frame 40 with a component 12 inserted into each of the spaces 80 between adjacent pairs of leads in the lead frame 40. The remainder of the second unplatted region 68 may then be removed by punching or cutting of the frame along the Section I—I illustrated in FIG. 2B.

Alternatively, a single die-cutting to remove the second unplatted region along the section I—I may be initially done before the components 12 are inserted in this openings 80 thereby eliminating the step of die-cutting along the Section H—H. In any event, whether the cutting is a two step process first along the Section H—H and then along the Section I—I or simply along the Section I—I, a portion of the lead frame 40 is removed so that the individual ends of the internal leads 58 are disconnected from the lead frame and available for attachment to an electronic component such as a capacitor.

As illustrated in FIG. 2C, the electrical component positioned between adjacent pairs of leads such as the leads 86 and 88 is inserted such that the unplatted centered regions 72 of the leads will not be in contact with the component 12. The component 12 with attached leads 86 and 88 in the opening 80 of the lead frame 40 is then encased, (either individually or in lead frame multiples,) by a suitable epoxy or other material to thereby encase the component and unplatted center region of the lead 72 to form a direct contact between the unplatted center region 72 of the leads 86 and 88 and the encasement of 14 as illustrated in FIG. 2C.

In a preferred embodiment of the method according to the invention, Each of the finished electrical devices on the lead frame 40 will be tested with the operable devices identified. One lead (70) from each device is first cut to allow for electrical measurements. The operable electrical devices so identified are then selected and cut along the section J—J as illustrated in FIG. 2C to thereby remove the completed electrical device 10 from the lead frame 40. The electrical devices which fail to meet the component specifications remain on the lead frame and are discarded. Alternatively, all of the components can be removed prior to testing by cutting the external leads 52 along the Section J—J with the individual components being tested thereafter.

Referring to FIG. 3, a cross section of a typical square or rectangular cross section lead through Section G—G is illustrated showing the lead 90 made of copper, silver or other suitable material with a solder plating on the surface of the lead 90 being a tin-lead alloy, a gold alloy or any other suitable solder material well known in the art. FIG. 4 illustrates a typical round cross sectional lead through section K—K of FIG. 1 showing a lead 100 with a solder plating 102 on its surface 104.

The above method has been described in connection with the manufacture of multiple components on a lead frame 40 with the leads having a solder plating on an external portion, a solder plating on an internal portion and a center portion without solder plating to define an unplatted region. However, the electrical component as illustrated in FIG. 1 can also be made by dipping one end of an individual lead in a solder bath to thereby plate an external portion and then rotating the lead 180 degrees and dipping the other end of the lead in the solder bath to thereby plate the second end of the lead, the two step process being such that the center region between the two plated portions is left unplatted and devoid of solder. Such a process is suitable for leads having a circular or oval cross-sectional shape.

It will be appreciated that many other variations in the apparatus and method of making leads described above are possible without departing from the invention in its broadest aspects. Accordingly, the following claims are intended to encompass all such variations and modifications that fall within the true spirit and scope of the invention.

I claim:

1. A method for making an electrical device having an encasement, an electronic component encased inside the encasement and leads interconnected to the electronic component and extending through the encasement for coupling the electronic component to an electrical circuit, whereby a sealed interface between the leads and the encasement is provided for preventing contaminants from entering the encasement through voids in the region between leads and the encasement, the method comprising the steps of:

providing a lead frame;
   punching out selected regions in the frame to define a first unpunched region, a first punched region, a center unpunched region, a second punched region, a second unpunched region, a plurality of external leads extending between the first unpunched region and the center unpunched region through the first punched region and a plurality of internal leads extending between the center unpunched region and the second unpunched region through the second punched region;
   masking the lead frame leaving only the external leads unmasked;

plating the unmasked external leads with solder;

thereafter masking the lead frame leaving only the internal leads unmasked;

plating the unmasked internal leads with solder;

punching out selected parts of the center region for defining a plurality of leads between the first unplatted region and the second unplatted region, each lead having an external plated region, an unplatted center region and an internal plated region;

removing a first selected portion of the lead frame for detaching the internal leads from the second unpunched region of the lead frame;

selecting pairs of adjacent internal leads;

coupling an electronic component between each selected pair of internal leads;

encasing each electronic component and its coupled internal leads in an encasement whereby the encasement encases the internal plated region of the leads and at least a part of the unplatted center region of the leads; and removing the electronic devices from a second selected portion of the lead frame whereby the ends of the external leads are detached from the first unpunched region of the lead frame.

2. The method of claim 1 further comprising the steps of:

defining specifications for the electronic device;

testing each electronic device to determine if it meets the specifications, the testing occurring after the step of encasing but before the step of removing the electronic devices; and identifying those electronic devices which meet the specifications, the step of removing the electronic devices further comprising removing only those electronic devices which meet the specifications.

3. In an electrical device having an encasement, an electronic component encased inside the encasement and leads interconnected to the electronic component and extending through the encasement for coupling the electronic component to an electrical circuit, a method of providing a sealed interface between the leads and the encasement for preventing contaminants from entering the encasement through voids in the region between leads and the encasement, the method comprising the steps of:

providing a lead frame defining a first support region, an external lead region, a center lead region, an internal lead region and a second support region;

punching out selected regions in the external lead region for defining a plurality of external leads;

punching out selected regions in the internal lead region for defining a plurality of internal leads;

plating only the external leads and internal leads with solder; and after plating punching out selected portions of the center region for defining a plurality of leads between the first support region and the second support region, each lead having an external lead region plated with solder, an unplatted center region and an internal lead region plated with solder.

4. The method of claim 3 further comprising the step of removing the second support region of the lead frame for detaching the internal leads from the second-support region of lead frame.

5. The method of claim 4 further comprising the steps of: selecting pairs of adjacent internal leads;

coupling an electronic component between each selected pair of internal leads;

encasing each electronic component and its coupled internal leads in an encasement whereby the encasement encases the internal plated region of the leads and at least a part of the unplatted center region of the leads.

6. The method of claim 5 further comprising the step of removing the first support region of the lead frame for detaching the ends of the external leads from the lead frame.

7. The method of claim 6 further comprising the steps of: defining specifications for the electronic device;

testing each electronic device to determine if it meets the specifications, the testing occurring after the step of encasing but before the step of removing the first support region of the lead frame; and identifying those electronic devices which meet the specifications, the step of removing the first support region of the lead frame further comprising the step of removing only those electronic devices which are identified as meeting the specifications.

8. A method of making a lead for being interconnected to an electronic component encased inside a housing, whereby the lead extends through the housing for being coupled to an electrical circuit external to the housing, the method comprising the steps of:

providing at least one lead having an internal surface region, an external surface region and a center surface region between the internal surface region and the external surface region;

plating the internal surface region of the lead with solder; and plating the external surface region of the lead with solder whereby the center surface region is devoid of solder.

9. The method of claim 8 further comprising the step of: attaching the internal surface region of the lead to the electronic component inside the housing; and encasing each electronic component and its attached lead in the housing whereby the housing encases the internal plated region of the lead and at least a part of the unplatted center surface region of the leads, interface between the unplatted center surface region of the leads and the housing providing a void free seal therebetween for preventing contaminants from entering the housing through voids in the region between leads and the housing.

* * * * *